(12) United States Patent
Sill

(10) Patent No.: US 6,248,251 B1
(45) Date of Patent: Jun. 19, 2001

(54) APPARATUS AND METHOD FOR ELECTROSTATICALLY SHIELDING AN INDUCTIVELY COUPLED RF PLASMA SOURCE AND FACILITATING IGNITION OF A PLASMA

(75) Inventor: Edward L. Sill, Phoenix, AZ (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 09/255,613

(22) Filed: Feb. 19, 1999

(51) Int. Cl.[7] .............................. B44C 1/22; C23F 1/02; C23C 16/00

(52) U.S. Cl. .................. 216/68; 118/723 AN; 118/723 I; 118/723 IR; 156/345; 204/192.32; 204/298.31; 204/298.34; 427/569

(58) Field of Search .................. 118/723 AN, 723 I, 118/723 IR; 156/345; 204/298.31, 298.34, 298.37, 192.32; 216/67, 68; 427/569

(56) References Cited

U.S. PATENT DOCUMENTS

| | | | |
|---|---|---|---|
| 5,468,296 | 11/1995 | Patrick et al. ................. | 118/723 MP |
| 5,569,363 | * 10/1996 | Bayer et al. ..................... | 204/192.32 |
| 5,811,022 | * 9/1998 | Savas et al. ............................. | 216/68 |
| 5,903,106 | * 5/1999 | Young et al. .................... | 315/111.41 |

FOREIGN PATENT DOCUMENTS 0 836 218 A2   4/1998 (EP).

* cited by examiner

Primary Examiner—Rodney G. McDonald
(74) Attorney, Agent, or Firm—Wood, Herron & Evans, L.L.P.

(57) ABSTRACT

A plasma etch apparatus (10) such as that for etching wafers in the manufacture of semiconductors includes a vacuum chamber (15) surrounded by a cylindrical dielectric wall (13). A coil (20) surrounds the chamber outside of the wall and is energized with medium frequency RF energy which is inductively coupled into the chamber to energize a plasma in the chamber to etch a semiconductor wafer (16) on a support (17) in the chamber. A generally cylindrical Faraday shield (30) surrounds the outside of the chamber in contact with the outside of the wall between the wall and the coil. The shield has a plurality of axially oriented slits (32) therein closely spaced around the shield and extending less than the height of the shield. One slit or gap (31) extends the full height of the shield and interrupts an otherwise continuous conductive path around the circumference of the chamber. The gap is about ⅛ inch wide, so that, upon initial energization of the coil, a momentary peak-to-peak RF voltage forms across the gap, which generates an electric field in the chamber in the vicinity of the gap which ignites the plasma.

27 Claims, 1 Drawing Sheet

APPARATUS AND METHOD FOR ELECTROSTATICALLY SHIELDING AN INDUCTIVELY COUPLED RF PLASMA SOURCE AND FACILITATING IGNITION OF A PLASMA

This invention relates to plasma processing and particularly to plasma etching with an inductively coupled plasma.

BACKGROUND OF THE INVENTION

In semiconductor wafer processing, inductively coupled plasmas (ICPS) have been used with success in plasma processing, particularly plasma etching, of semiconductor wafer substrates. One processing apparatus for etching semiconductor wafers with an ICP is disclosed in Bayer et al. U.S. Pat. No. 5,569,363, hereby expressly incorporated by reference herein. In the Bayer et al. patent, RF energy is applied to a coil that surrounds a vacuum chamber outside of a chamber wall made of quartz. The coil generates a magnetic field within the chamber which excites electrons and forms a plasma. While the field is largely inductively coupled, the development of a high peak to peak voltage across the coil causes some degree of capacitive coupling of energy into the chamber. Such voltage has, in situations, developed a sheath of 900 to 1000 volts, for example, which imparts substantial energy to ions in the plasma. Such energy is enough to cause an undesirable degree of sputtering of the inside of the chamber wall and the sheath reduces the useful volume of the plasma.

It has been proposed to add a metal Faraday shield around the outside of the chamber, between the coil and the chamber wall. The proposed shield is provided with slits that extend axially but which leave a complete circumferential band around each edge of the shield. The shield is grounded to prevent capacitive coupling of voltage into the chamber while the slits prevent the inductive shielding of magnetic energy that is required to energize the plasma. Such a proposed shield, unfortunately, has the effect of preventing initial ignition of the plasma by the coil, requiring a separate electrode or discharge element to start the plasma.

There is a need, therefore, to provide for the shielding of a chamber from capacitive coupling effects when a coil is employed to inductively couple energy into a chamber, and to do so without interfering with plasma ignition.

SUMMARY OF THE INVENTION

An objective of the present invention is to provide shielding of a chamber from capacitive coupling. A particular objective of the invention is to provide efficient shielding from an RF coil that is provided around the chamber to inductively couple RF energy into plasma within the chamber. It is a further objective of the present invention to provide shielding that prevents capacitive coupling between a chamber and an exterior coil while facilitating plasma ignition.

In accordance with the principles of the present invention, a plasma processing chamber, particularly an etching chamber, is provided having an external loop-shaped RF inductor. The inductor is preferably a helical coil for inductively coupling RF energy into the chamber to form a plasma within the chamber. In addition, a Faraday shield is provided outside of the chamber wall between the wall and the inductor. The shield is grounded so as to provide effective shielding of capacitive coupling of voltage from the coil to the plasma within the chamber and is slitted to allow inductive coupling of the RF energy into the chamber. The ground connection is localized to a limited section of the inductor so as to allow a peak-to-peak voltage to develop across the gap when the RF current is initially induced into the shield from the inductor.

In the preferred embodiment of the invention, a cylindrical shield is positioned against the outside of a quartz chamber wall between the wall and a helical coil that encircles the wall and is spaced slightly from the wall. The shield preferably has a plurality of closely spaced internal slits extending axially almost the height of the shield, but less than the entire height of the shield, leaving at least one edge of the shield uninterrupted by the slits, thereby leaving at least one circumferential path of uninterrupted metal conductor around almost the entire circumference of the chamber. At one point in the circumference, a full height slit or gap interrupts the entire height of the shield, thereby avoiding a continuous 360° circumferential conductive path formed by the shield around the chamber.

In the preferred embodiment, the coil, which surrounds the chamber outside of the shield, inductively couples RF energy into the chamber to energize a plasma. The shield is preferably grounded at only one point on its circumference, for example, at a point directly opposite or 180° from the full height gap. Preferably, the gap, as well as the internal slits, are approximately 1/8 inch wide, with strips of the metallic portion of the shield being about 1/8 inch wide between the slits and gap.

When the coil is initially energized with RF energy and before a plasma exists in the chamber, a peak-to-peak voltage develops across the coil. The energization of the coil couples an RF voltage onto the shield which results in a peak-to-peak voltage developing across the narrow full height gap. When the shield is grounded diametrically opposite the gap, the voltages on the opposite edges of the shield bordering the gap are equal and opposite relative to ground potential. This peak-to-peak voltage may be several thousand volts, for example, 5000 volts RF, peak-to-peak. This voltage produces a strong RF electric field that extends through the quartz chamber wall and into the chamber where, within a time interval in the order of one or a few milli-seconds, it ignites a plasma opposite the gap inside the chamber. The plasma, once ignited, propagates, also in a time interval in the order of a milli-second, around the perimeter of the chamber inside of and close to the chamber wall, where the plasma forms a belt of conductive ionized gas around the circumference of the chamber inside of the chamber. When this plasma belt forms, the voltage across the gap of the shield quickly drops to a nominal voltage in the order of 10 to 20 volts, for example, 14 volts, peak-to-peak.

With the present invention, a plasma is formed that fills the chamber with very low capacitive coupling of voltage from the coil to the plasma, resulting in a low plasma potential and small plasma sheath between the plasma and the circumferential quartz side wall of the chamber. At the same time, the shield couples energy form the coil to quickly ignite a plasma upon the initial energization of the coil.

These and other objectives of the present invention will be readily apparent from the following detailed description of the present invention in which:

DETAILED DESCRIPTION OF THE PREFERRED EMBODIMENTS

Figure 1:
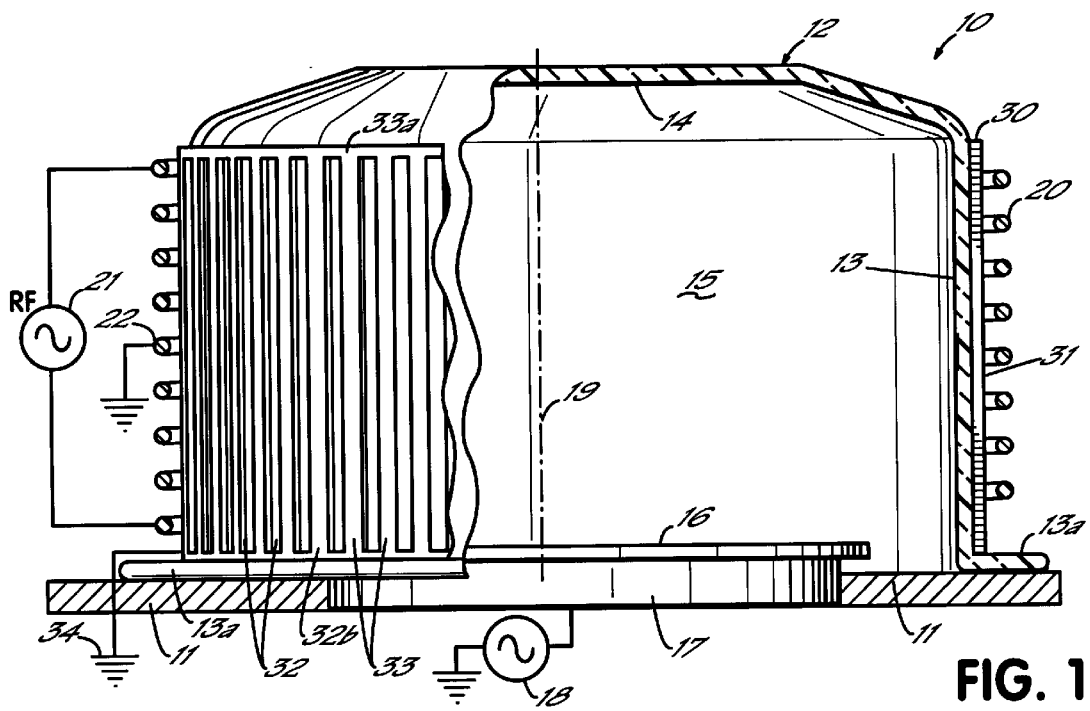
FIG. 1 is a side view of a sputter etching apparatus, partially broken away, embodying principles of the present invention.
Figure 2:
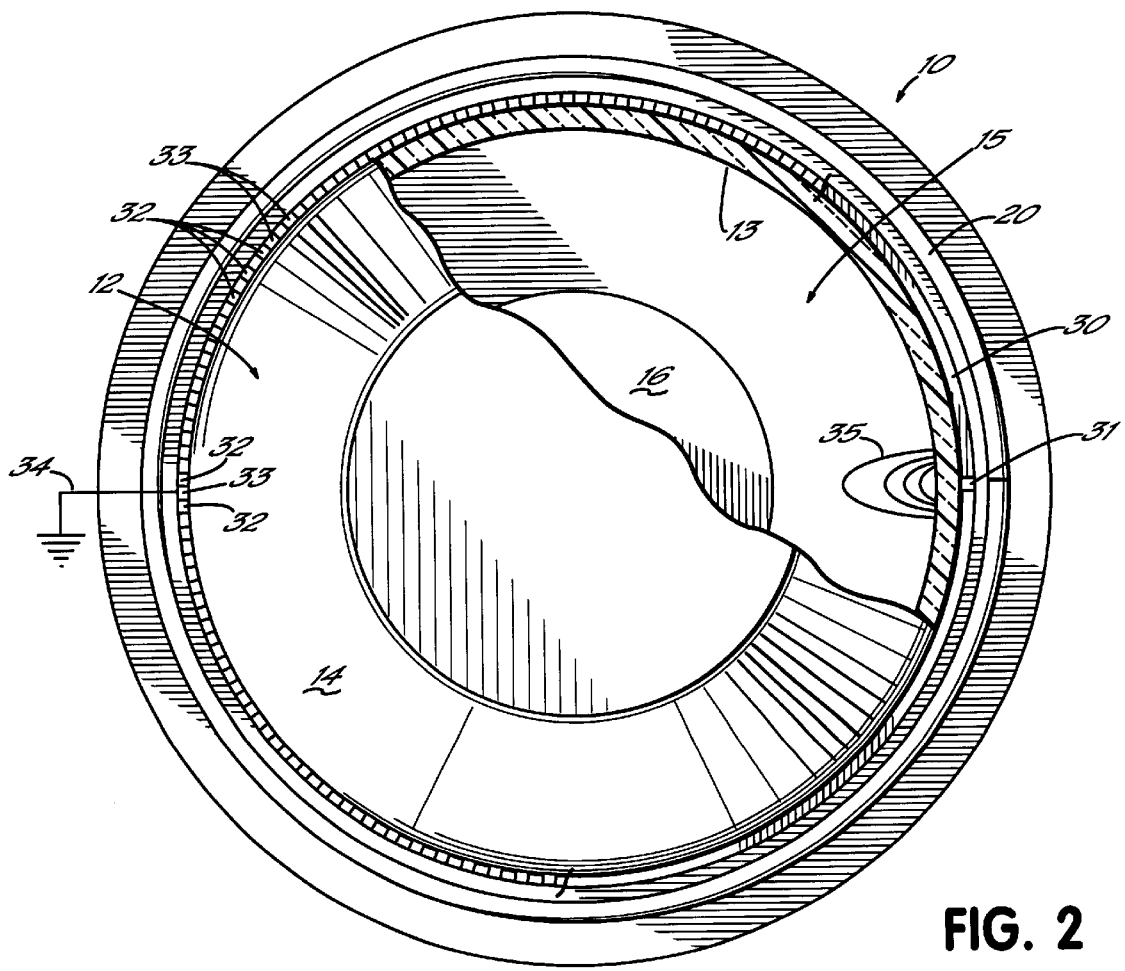
FIG. 2 is a top view, partially in cross-section, of the apparatus of FIG. 1.

FIG. 1 illustrates a plasma etching apparatus 10 having a base 11 to which is sealed a quartz bell jar 12 having a circumferential side wall 13 and an integral top 14. The sidewall 13 is typically approximately 15 to 16 inches in diameter and about 3/8 inches thick. The bell jar 12 has a lip 13a which is sealed to the base 11 to provide a vacuum tight chamber 15 in which is processed a substrate, such as a wafer 16, supported on a substrate support 17. An RF generator 18, preferably a high frequency generator at, for example, 13.56 MHZ, is connected to the substrate support 17 to produce a negative bias on the substrate 16 and control the energy of positive ions from plasma in the chamber 12 for etching the substrate. The bell jar 12 and support 17 are centered on an axis of symmetry 19 of the chamber 145 and sidewall 13.

Surrounding the cylindrical side wall 13 of the bell jar 12, spaced a close distance of 1/16 to 1/4 inches, preferably about 1/8 inches, from the outside of the wall 13, is a helical coil 20. The coil 20 is connected across an RF generator 21 which operates to energize the coil with RF energy preferably at a medium frequency of, for example, 460 KHz. The coil 20 in the illustrated embodiment is grounded at its center 22. The coil 20, when energized, couples RF energy into the chamber 15 to support a plasma for etching the substrate 16 on the support 17.

Also surrounding the cylindrical side wall 13 of the bell jar 12 and preferably in close proximity to or in contact with the outer surface of the wall 13 is a Faraday shield 30. The shield 30 is formed of a conductive sheet metal material and forms a loop that surrounds the wall 13 inside of the coil 20 which is spaced by a cylindrical space 29 from the shield 30. The shield 30 substantially surrounds the wall 13 but for a narrow gap 31 along one side of the wall 13 about 1/8 inches wide. The gap 31 is disposed parallel to the axis 19 of the cylindrical sidewall 13 of the bell jar 12. The gap 31 completely interrupts current paths around the circumference of the shield except for a small amount of capacitive conductivity of the RF energy across the gap 31. The shield 30 is also provided with a plurality of slits 32 that are separated by conductive strips 33, each about 120 in number and of approximately equal width. The slits 32 are disposed parallel to the gap 31 and parallel to the axis 19 of the chamber 15. The slits 32 each have a length which is approximately 1/4 inch less than the height of the shield 30, which in turn is preferably greater than the height of the coil 20. The conductive strips 33 each connect at their upper end to a horizontal band 33a and at their lower end to a horizontal band 33b, which bands each completely encircle the bell jar except where they are interrupted by the upper and lower ends of the gap 31. The shield 30 is grounded at a single angular position 34 on its circumference, preferably diametrically opposite the gap 31.

When the coil 20 is first energized by the energy from the RF generator 21, a circumferential RF current is induced in the shield 30 which is accompanied by a voltage that is neutral at the ground point 34 but is in the order of magnitude of 1000 peak-to-peak volts across the gap 31. This peak-to-peak voltage is further accompanied by an RF electrical field 35 at the gap 31 which extends through the wall 13 in the vicinity of the gap 31 into the chamber 12. In the vacuum of the chamber 12, which may contain, for example, an inert gas such as argon at a pressure of from 1 mTorr to 10 Torr, the electrical field 35 across the gap 31 on the inside of the chamber wall 12 ignites a plasma in the vicinity of the gap 31 within a millisecond or so after the coil 20 is first energized. This plasma results in the production, within a millisecond or so after plasma ignition, of a sheath of electrons about 2 centimeters in width encircling the chamber 12 and oscillating at the frequency of the RF energy, immediately inside of the cylindrical side wall 13, whereupon the voltage across the gap 31 drops to a voltage in the range of from 10 to 20 volts. Upon formation of the sheath, a plasma quickly fills the chamber 12.

The shield 30 effectively reduces or substantially eliminates capacitive coupling of energy from the coil 20 to the plasma in the chamber 12 that would impart a high potential and a correspondingly large surrounding plasma sheath to the plasma in the chamber 12. As a result, plasma etching of the quartz bell jar 12 is minimized. The shield 30 does so without interfering with the ignition of the plasma, and rather, functions to quickly and efficiently ignite a plasma in the chamber 12 upon the energization of the coil 20.

From the above description of the invention and the preferred embodiments, one skilled in the art will appreciate that variations and additions may be made to the processes and the equipment described without departing from the principles of the invention.

What is claimed is:

1. An apparatus for plasma processing a substrate comprising:
   a vacuum chamber having a dielectric wall;
   an inductor positioned outside of the chamber in proximity to the wall;
   an RF energy source connected to the inductor;
   a Faraday shield positioned between the inductor and the wall, the shield being in the shape of a loop having opposite ends and a circumference interrupted by at a full height gap that interrupts the entire height of the shield and is bordered by the opposite ends of the shield, whereby the opposite ends of the shield are in close proximity to each other across the gap;
   the shield having a localized ground connection that allows RF current induced around the loop to develop a peak-to-peak voltage across the opposite ends of the loop and the gap that is sufficiently high, when no RF plasma is present in the chamber, to produce a plasma igniting electric field adjacent the gap inside of the wall of the chamber.

2. The apparatus of claim 1 wherein:
   the gap is between approximately 1/16 and 1/8 inch wide.

3. The apparatus of claim 2 wherein:
   the gap is approximately 1/8 inch wide.

4. The apparatus of claim 1 wherein:
   the shield is in contact with the outside of the dielectric chamber wall.

5. The apparatus of claim 1 wherein:
   the wall of the chamber is cylindrical and defines an axis of symmetry;
   the inductor is a helical coil surrounding the cylindrical chamber wall; and
   the shield is cylindrical and has a height at least as great as that of the coil with the gap extending the height of the shield and disposed substantially parallel to the axis of symmetry of the cylindrical chamber wall.

6. The apparatus of claim 5 wherein:
   the shield has a plurality of circumferentially-spaced slots therein extending only partially the height of the shield which are disposed generally parallel to the axis of symmetry of the cylindrical chamber wall.

7. The apparatus of claim 1 wherein:
the shield has a plurality of transverse slots therein spaced along the circumference of the shield, each slot extending partially across the loop.

8. The apparatus of claim 1 wherein:
the localized ground connection is located at one section of the circumference of the loop approximately midway between the opposite ends.

9. A plasma etching apparatus comprising:
a vacuum chamber having and axis and a dielectric side wall surrounding the axis;
a coil outside of the chamber and surrounding the dielectric side wall;
an RF energy source connected across the coil;
an electrically conductive Faraday shield extending in a loop circumferentially around the outside of the chamber adjacent the outside of the side wall between the coil and the side wall, the shield having a full height gap that interrupts the entire height of the shield and is bordered by opposite ends of the shield and being grounded along a limited portion of its circumference such that RF current induced around the loop develops a peak-to-peak voltage across the loop that is sufficiently high to produce a plasma igniting electric field in the vicinity of the gap inside of the wall of the chamber.

10. The apparatus of claim 9 wherein:
the gap is between approximately 1/16 and 1/8 inch wide.

11. The apparatus of claim 9 wherein:
the shield is in contact with the outside of the chamber wall.

12. The apparatus of claim 9 wherein:
the wall of the chamber is cylindrical and defines an axis of symmetry;
the inductor is a helical coil surrounding the cylindrical chamber wall; and
the shield is cylindrical and has a height at least as great as that of the coil with the gap being an axial gap extending the height of the shield.

13. The apparatus of claim 12 wherein:
the shield has a plurality of spaced axial slots therein extending only partially the height of the shield.

14. The apparatus of claim 9 wherein:
the shield has a plurality of axial slots therein extending partially across the loop and spaced along the circumference of the shield.

15. The apparatus of claim 9 wherein:
the shield has a ground connection located at one section of the circumference of the loop approximately midway between the ends.

16. A method of electrostatically shielding an inductively coupled RF plasma source and igniting a plasma in a vacuum processing chamber, the method comprising the steps of:
providing an inductor outside of the wall of a processing chamber in a position to inductively couple RF energy into a plasma in the chamber when energized therewith;
providing a shield between the inductor and the wall in a loop substantially encircling the chamber wall that is interrupted by at least one full height gap that interrupts the entire height of the shield;
grounding the shield at only a selected limited portion of the loop so as to allow a peak-to-peak RF voltage to develop in the shield across the gap; and
igniting a plasma in the chamber by energizing the inductor with an RF energy to induce RF current momentarily in the shield and produce a peak-to-peak voltage across the gap of the shield to produce an electric field inside the wall of the chamber in the vicinity of the gap to ignite the plasma in the chamber.

17. The method of claim 16 wherein:
the inductor providing step includes the step of providing a helical coil outside of the wall and surrounding the processing chamber;
the shield providing step includes the step of providing a cylindrical shield located between the coil and the wall in contact with the wall; and
the at least one gap is a gap extending along one side of the chamber.

18. The method of claim 16 wherein:
the shield providing step includes the step of providing a shield having a gap that is between approximately 1/16 and 1/4 inches in width.

19. The method of claim 16 wherein:
the shield providing step includes the step of providing a shield having a plurality of spaced slits therein extending almost, but less than, entirely across the shield, the slits being approximately as wide as the gap and having spacings between the slits about as wide as the gap.

20. The method of claim 16, further comprising the steps of:
providing a wafer in the chamber and sealing the chamber before energizing the inductor; and
following ignition of the plasma, continuing to energize the plasma with energy inductively coupled from the inductor, electrically attracting ions from the plasma onto the surface of the wafer and etching the wafer therewith.

21. An apparatus for plasma processing a substrate comprising:
a vacuum chamber having a dielectric wall;
an inductor positioned outside of the chamber in proximity to the wall;
an RF energy source connected to the inductor;
a Faraday shield positioned between the inductor and the wall, the shield being made of electrically conductive material and formed in the shape of at least one loop having at least one full height gap therein that interrupts the entire height of the shield and is oriented to interrupt the path of current induced therein by RF energy coupled by the coil from the source, the at least one gap defining opposed ends of the material in sufficiently close proximity to each other across the at least one gap to produce a temporary peak-to-peak voltage across said opposite ends that is sufficiently high adjacent the gap, on the opposite side of the wall therefrom, inside of the chamber, to produce an electric field that is effective to ignite a plasma inside of the chamber.

22. The apparatus of claim 21 wherein:
the at least one gap is a single gap completely interrupting the circumference of the shield.

23. The apparatus of claim 21 wherein:
the shield has a localized ground connection so as to provide effective shielding of capacitive coupling of voltage from the coil to the plasma within the chamber.

24. The apparatus of claim 21 wherein:

the shield has a plurality of slits therein effective to allow inductive coupling of the RF energy into the chamber.

25. The apparatus of claim 21 wherein:

the shield has a ground connection that is localized to a limited section of the inductor so as to allow a peak-to-peak voltage to develop across the gap when the RF current is initially induced into the shield from the inductor.

26. The apparatus of claim 21 wherein:

the temporary peak-to-peak voltage is at least several thousand volts.

27. The apparatus of claim 21 wherein:

the temporary peak-to-peak voltage is approximately 5000 volts.

* * * * *

UNITED STATES PATENT AND TRADEMARK OFFICE
CERTIFICATE OF CORRECTION

PATENT NO.    : 6,248,251 B1
DATED         : June 19, 2001
INVENTOR(S)   : Edward L. Sill It is certified that error appears in the above-identified patent and that said Letters Patent is hereby corrected as shown below:

Column 1,
Line 12, reads "(ICPS)" and should read -- $(ICP_s)$ --.
Line 22, reads "peak to peak" and should read -- peak-to-peak --.

Column 2,
Line 41, reads "milli-seconds" and should read -- milliseconds --.
Line 43, reads "milli-second" and should read -- millisecond --.
Line 56, reads "couples energy form the coil" and should read -- couples energy from the coil --.
Line 66, reads "cross-section" and should read -- cross section --.

Column 3,
Line 6, reads "side wall 13" and should read -- sidewall 13 --.
Lines 8, 20, 21 and 36, read "inches" and should read -- inch --.
Line 12, reads "13.56MHZ" and should read -- $13.56MH_z$ --.
Line 16, reads "chamber 145" and should read -- chamber 15 --.
Lines 19 and 29, read "side wall" and should read -- sidewall --.
Line 24, reads "460 $KH_z$" and should read -- 460 $kH_z$ --.

Column 4,
Line 6, reads "side wall" and should read -- sidewall --.
Line 35, reads "by at a full" and should read -- by a full --.

Column 5,
Line 11, reads "having and axis" and should read -- having an axis --.

UNITED STATES PATENT AND TRADEMARK OFFICE
CERTIFICATE OF CORRECTION

PATENT NO. : 6,248,251 B1
DATED : June 19, 2001
INVENTOR(S) : Edward L. Sill

It is certified that error appears in the above-identified patent and that said Letters Patent is hereby corrected as shown below:

<u>Column 6,</u>
Line 21, reads "inches" and should read -- inch --.

Signed and Sealed this

Fifth Day of March, 2002

Attest:

JAMES E. ROGAN
*Director of the United States Patent and Trademark Office*

*Attesting Officer*